United States Patent [19]
Iwasa

[11] Patent Number: 5,959,319
[45] Date of Patent: Sep. 28, 1999

[54] SEMICONDUCTOR MEMORY DEVICE HAVING WORD LINE CONDUCTORS PROVIDED AT LOWER LEVEL THAN MEMORY CELL CAPACITOR AND METHOD OF MANUFACTURING SAME

[75] Inventor: Shoichi Iwasa, Tokyo, Japan

[73] Assignee: Nippon Steel Corporation, Tokyo, Japan

[21] Appl. No.: 08/631,682

[22] Filed: Apr. 16, 1996

[30] Foreign Application Priority Data

Apr. 18, 1995 [JP] Japan ..................... 7-116543

[51] Int. Cl.⁶ ............................. H01L 27/108
[52] U.S. Cl. ............................ 257/296; 257/306
[58] Field of Search ............... 257/296, 306–309, 257/315, 316; 365/149

[56] References Cited

U.S. PATENT DOCUMENTS

| | | | |
|---|---|---|---|
| 4,962,322 | 10/1990 | Chapman | 257/315 |
| 5,151,772 | 9/1992 | Takahashi et al. | 357/71 |
| 5,247,196 | 9/1993 | Kimura | 257/308 |
| 5,274,258 | 12/1993 | Ahn | 257/308 |
| 5,412,237 | 5/1995 | Komori et al. | 257/296 |
| 5,572,053 | 11/1996 | Ema | 257/308 |
| 5,604,365 | 2/1997 | Kajigaya et al. | 257/306 |

OTHER PUBLICATIONS

Japanese Journal, "Nikkei Micro–Devices", Aug. 1994, pp. 32–37, Nikkei Business Publications, Inc.

*Primary Examiner*—Sara Crane
*Attorney, Agent, or Firm*—Pollock, Vande Sande & Amernick

[57] ABSTRACT

A semiconductor memory device has word line conductor films, bit line conductor films transverse to the word line conductor films and memory cells provided at intersections between the word line conductor films and bit line conductor films. Each memory cell has a transistor structure formed at a surface portion of a semiconductor substrate and a capacitor structure formed over the semiconductor substrate. The word line conductor films are formed at a level lower than the capacitor structures of the memory cells to improve the resolution of patterns for the semiconductor memory device.

5 Claims, 8 Drawing Sheets

(CELL ARRAY SECTION)     (PERIPHERAL CIRCUIT SECTION)

(CELL ARRAY SECTION)  (PERIPHERAL CIRCUIT SECTION)

SEMICONDUCTOR MEMORY DEVICE HAVING WORD LINE CONDUCTORS PROVIDED AT LOWER LEVEL THAN MEMORY CELL CAPACITOR AND METHOD OF MANUFACTURING SAME

BACKGROUND OF THE INVENTION

This invention relates to a semiconductor memory device such as a DRAM (Dynamic Randon Access Memory) and method of manufacturing the same.

In the conventional semiconductor memory device, such as a one-transistor/one-capacitor type DRAM, the technique for increasing the storage node height in the height direction of the memory cell is apt to be employed to increase the cell capacitance as in the stacked DRAM memory cell structure (hereinafter, referred to as "STC structure") because the increase of the surface area of the capacitor portion is limited in terms of the memory size. The dependency on this technique becomes greater as the integration density of the DRAM increases. Some examples of the STC structure are described in, for example, NIKKEI MICRODEVICES, July 1994 (published by NIKKEI Business Publications, Inc.), pp 32–37.

However, increasing the height of the memory cell portion of the STC structure makes the level difference larger between the cell array section and the peripheral circuit section. Thus, when patterning the metal conductors, such as bit lines, formed over the cell array and peripheral circuit sections, it will be difficult to achieve a high resolution for fine-pattern conductors because of lack of the DOF (Depth Of Focus) margin of photolithography. In other words, since the pitch of the bit lines becomes narrow with the decrease of the distance between the cells, the above problem becomes serious. The DOF margin in this photolithography is not described in the NIKKEI MICRODEVICES mentioned above.

SUMMARY OF THE INVENTION

Thus, the present inventor experimentally produced and investigated a COB (Capacitor Over Bitline) structure as a means for solving this problem, as shown in FIGS. 1A and 1B and FIGS. 2A and 2B.

FIG. 1A is a schematic plan view of the cell array section of the COB structure showing the layout of the bit lines 106 and members located below the bit lines, and FIG. 1B is a schematic plan view thereof showing the layout of members located above the bit line 106. FIG. 2A is a schematic cross-sectional view taken along line IIA—IIA in FIG. 1A, and FIG. 2B is a schematic cross-sectional view taken along line IIB—IIB in FIG. 1A, together with a selection transistor portion in the peripheral circuit section which is shown on the right-hand side.

Referring to FIG. 1A and FIGS. 2A and 2B, a plurality of gate electrode connection conductors 103 of N-type polycrystalline silicon layers are formed over a P-type silicon substrate 101 in the longitudinal direction, and N-type diffusion layers 104, 105 are formed in regions of the silicon substrate 101 defined by the gate electrode connection conductors 103 and isolation oxide films 102. In the lateral direction on the silicon substrate 101 are formed a plurality of bit lines 106 of laminated connection conductors which are comprised of tungsten silicide and N-type polycrystalline silicon layers. The bit lines 106 are connected through bit contacts 104a to the N-type diffusion layers 104. The other N-type diffusion layers 105 are connected through storage node contacts 105a to capacitor storage node electrodes 110.

As illustrated in FIG. 1B and FIGS. 2A and 2B, cell plate electrodes 112 of an N-type polycrystalline silicon layer are formed on capacitance insulating films 111 of an ONO (oxide-nitride-oxide) film over the storage node electrodes 110. In addition, word lines (strapping word lines) 114 made of low-resistance conductors such as aluminum or tungsten, are formed on a second interlayer insulating film 113 of BPSG (borophosphosilicate glass) over the cell plate electrodes. These word lines 114 are made in contact with the underlying gate electrode connection conductors 103 at predetermined locations not shown.

Moreover, there are shown gate oxide films 107, side wall oxide films 108 and first interlayer insulating layers 109 of BPSG.

FIG. 3 shows an equivalent circuit of the memory cell array section.

In the above-mentioned structure, there are formed memory cells each of which is comprised of a transfer gate MOS transistor T and a capacitor C and which acts as a one-bit memory cell. The transistor is formed of the gate electrode connection conductor 103, as the gate electrode, and a pair of N-type diffusion layers 104, 105, which act as the source and drain between which the gate is formed. The capacitor is comprised of the storage node electrode 110 connected to the one N-type diffusion layer 105 of the MOS transistor, and the capacitance insulating film 111 and cell plate electrode 112 formed over the node electrodes. In other words, every two adjacent memory cells along the bit lines 106 share one N-type diffusion layer, and the paired N-type diffusion layers 104 and 105 of each memory cell are displaced to each other in the direction of the gate electrode connection conductors 103, or along the word lines 114.

In addition, the so-called COB structure is produced in which the capacitor C of each memory cell is formed above the bit line 106.

In this COB structure, since the bit lines 106 can be formed at a relatively low level as shown in FIG. 2B, the level difference of the bit lines 106 between the cell array section and the peripheral circuit section can be substantially reduced to zero, and hence the problem with the fine patterning mentioned above can be solved.

In the COB structure, however, the level difference of the word lines 114 between the cell array section and the peripheral circuit section still remains large, or it was found that a large level difference d exists between the cell array section and the peripheral circuit section as shown in FIG. 2B.

In general, even if the cells are reduced to a very small size, the cell capacitance would not be subjected to the scaling, because it is required to always keep the same capacitance value (for example, normally 25 through 30 fF for 64M DRAM through 256M DRAM) in consideration of soft error. Thus, since the cell capacitance depends on the two-dimensional cell size, the storage node electrodes 110 are often raised to a higher level to increase the capacitance. As a result, the level difference d between the cell array section and the peripheral circuit section becomes increasingly large. Thus, the defocusing problem in the photolithography for word lines 114 cannot be completely solved. In addition, the pitch of the gate electrode connection conductors 103, or of the word lines 114, and the line width and space are reduced to the small values, and therefore the DOF margin to word lines 114 is decreased even more.

In the conventional COB structure, as shown in FIGS. 1A and 1B the storage node contacts 105a are formed by use of the mask of bit lines 106, the size of the storage node contacts 105a in the direction perpendicular to the bit lines 106 can be defined by self alignment, but for the direction perpendicular to the gate electrode connection conductors 103 it is necessary to provide a distance x including an alignment margin (see FIG. 1A), the distance being to the gate electrode connection conductors 103, in the photolithographic processing. However, when the pitch of the gate electrode connection conductors 103 is very small, as is the case in recent years, this necessity is one of the restrictions of fine patterning.

Accordingly, it is an object of the invention to provide a semiconductor memory device and method of producing same which are capable of solving such problems as the level difference of word lines between the cell array section and the peripheral circuit section and as the alignment margin for the storage node contacts in the production of the DRAM of the COB structure.

According to one aspect of the present invention, a semiconductor memory device includes word line conductor films, bit line conductor films transverse to the word line conductor films and memory cells provided at intersections between the word line conductor films and bit line conductor films, wherein each memory cell has a transistor structure formed at a surface portion of a semiconductor substrate and a capacitor structure formed over the semiconductor substrate, and the word line conductor films are formed at a level lower than the capacitor structures of the memory cells.

According to another aspect of the present invention, in the semiconductor memory device, a lower electrode film of the capacitor structure of each memory cell has a contact to one of a pair of active layers of the transistor structure of the memory cell. The device further includes insulating films for isolating the word line conductor films from the lower electrode films of the capacitor structures overlying the word line conductor films and conductive films formed between the lower electrode films of the capacitor structures and the insulating films. These conductive films, when contact holes for the contacts to the active layers are formed by etching, serve as etching stop masks for defining widths of the contact holes measured in the direction of the widthwise word line conductor films.

Thus, by employing the COW (Capacitor Over Word line) structure in which the word line conductor films are formed under the memory capacitor structures of the memory cells, it is possible to locate the word line conductor films at a relatively low level and thus solve the problem of the level difference of the word line conductor films between the cell array section and the peripheral circuit section.

In addition, by using the pattern of word line conductor films as an etching mask when the storage node contacts for the capacitor structure are formed after the word line conductor films, it is possible to define the storage node contacts relative to the word line conductor films in a self alignment manner and thus it is no longer necessary to provide the alignment margin to the word line conductor films.

DESCRIPTION OF THE PREFERRED EMBODIMENTS

One embodiment of the present invention will be described with reference to FIGS. 4A, 4B, 5A, 5B and 6A–6G.

Figure 1A:
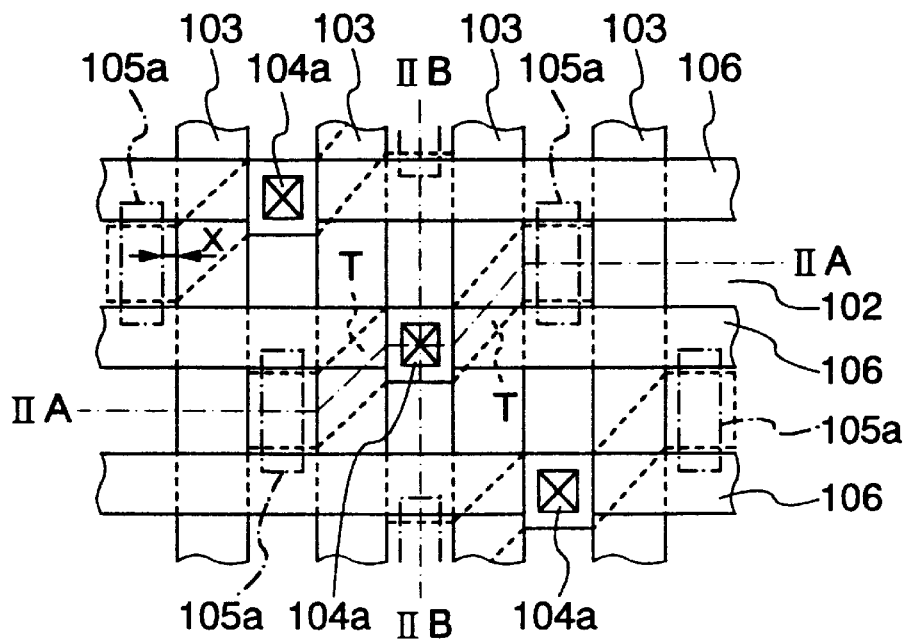
FIGS. 1A and 1B are plan views of the geometrical layout of patterns in the DRAM which was experimentally produced and investigated by the inventor prior to the present invention.
Figure 1B:
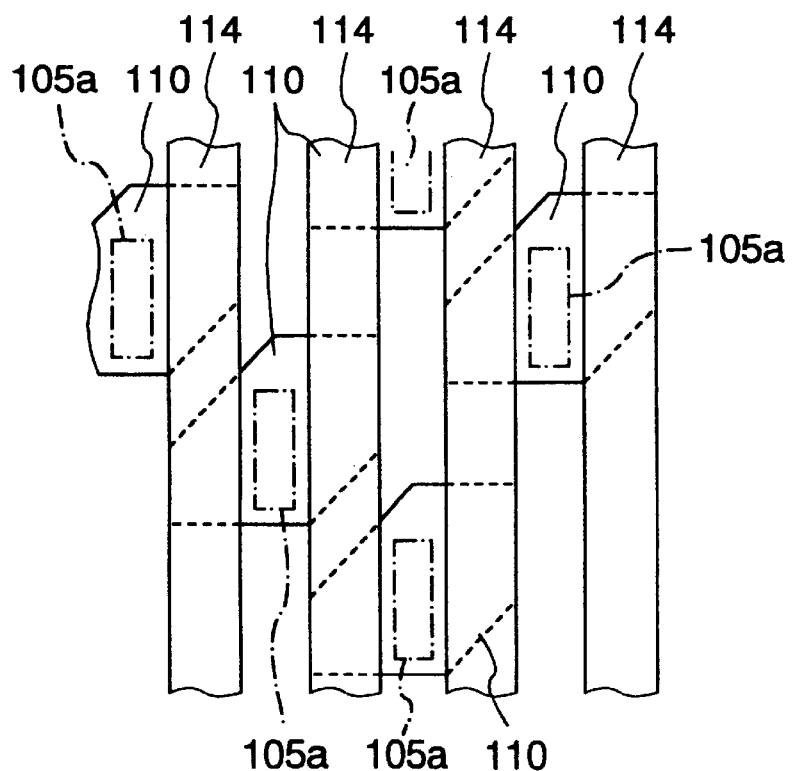
Figure 2A:
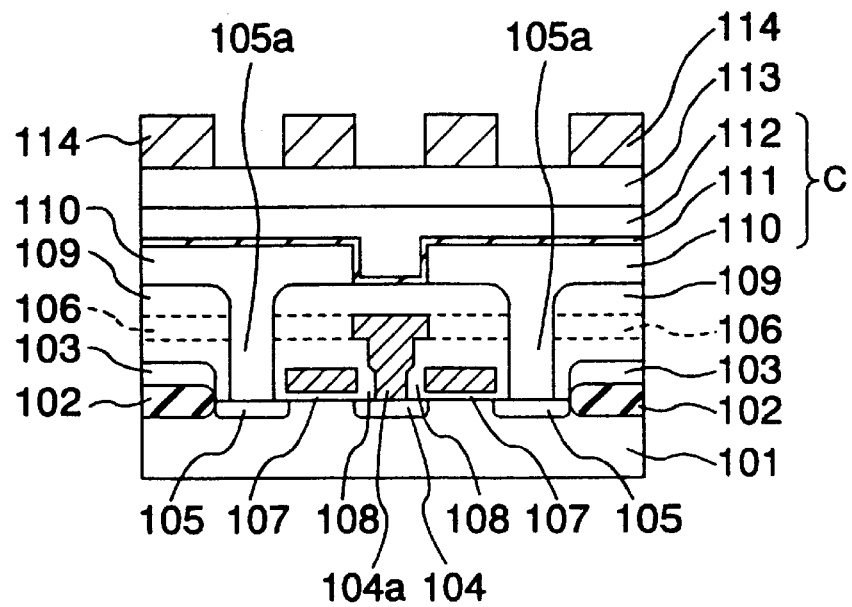
FIGS. 2A and 2B are cross-sectional views taken along lines IIA—IIA and IIB—IIB.
Figure 2B:
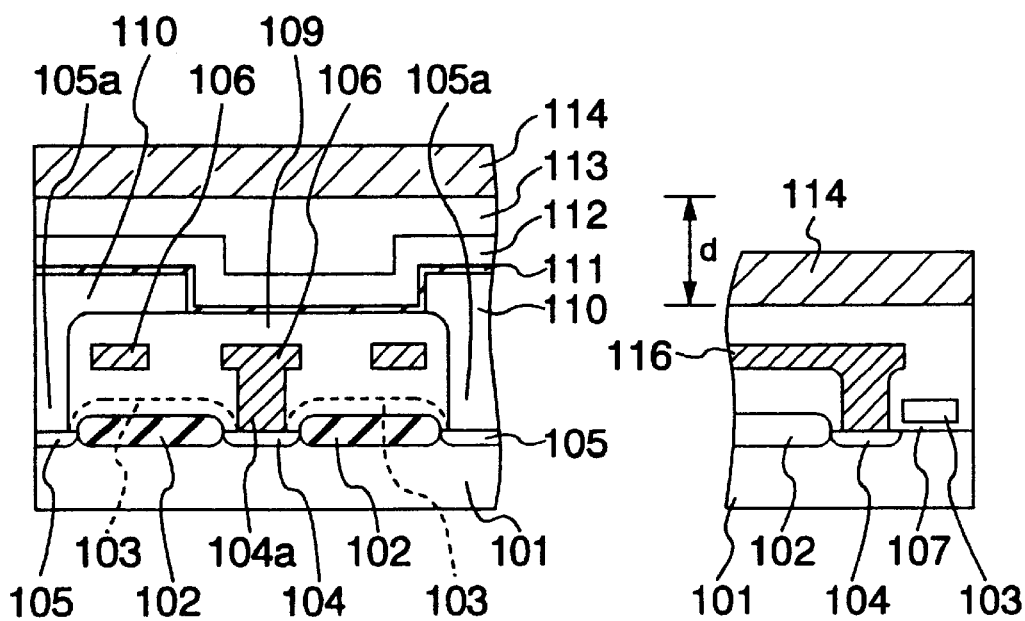
Figure 3:
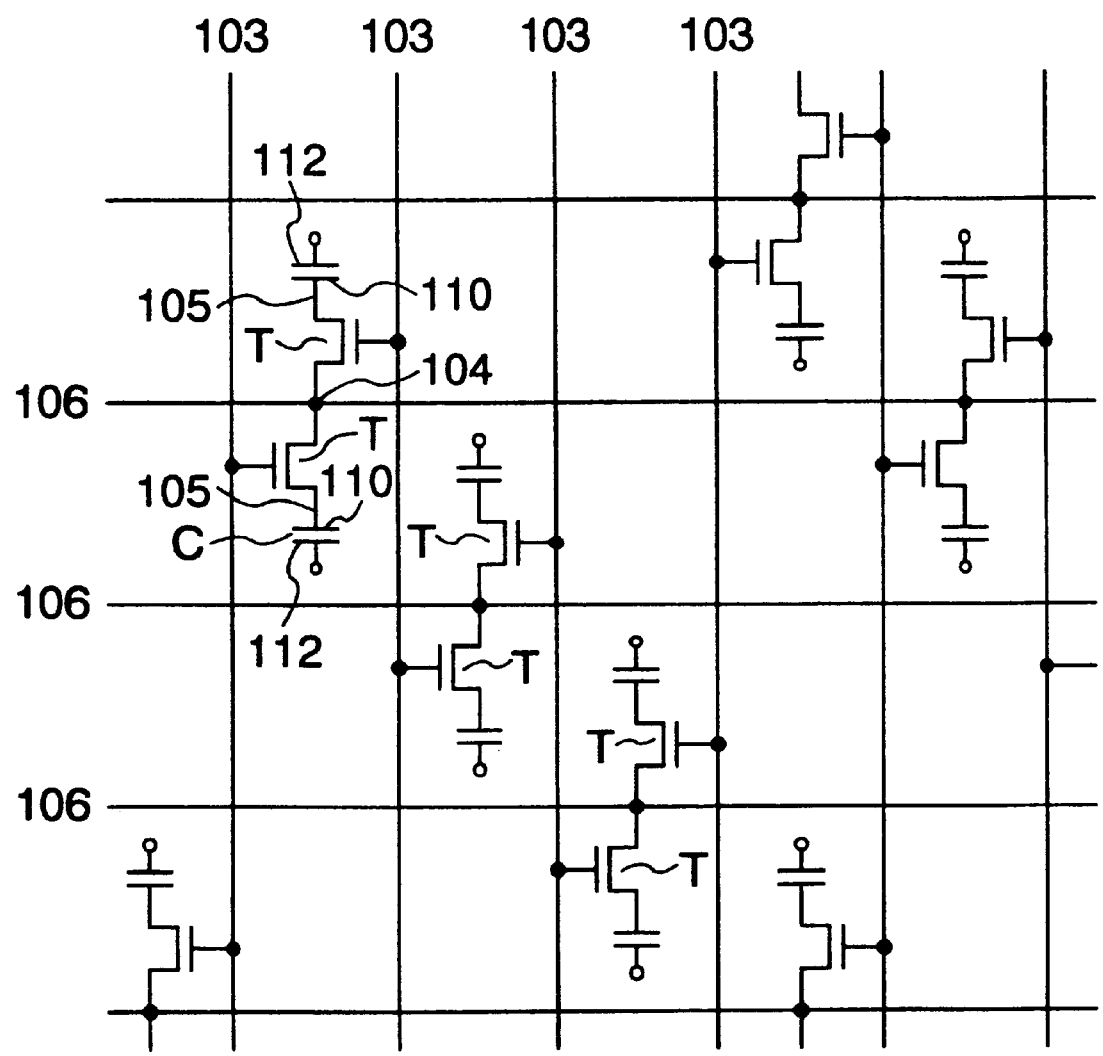
FIG. 3 shows an equivalent circuit of the memory cell array section of the DRAM illustrated in FIGS. 1A and 1B.
Figure 4A:
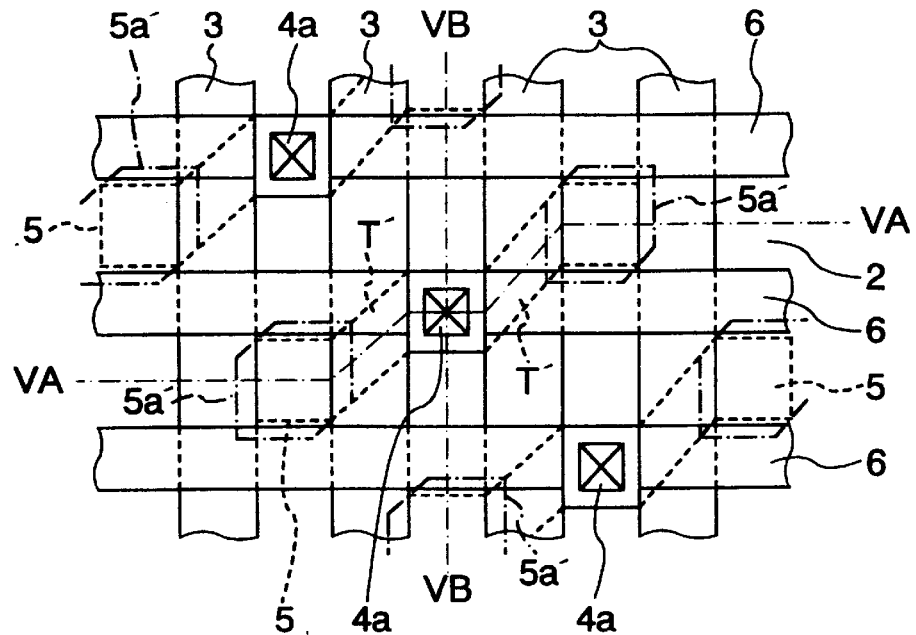
FIGS. 4A and 4B are plan views of the geometrical layout of patterns in the DRAM of one embodiment of the present invention.
Figure 4B:
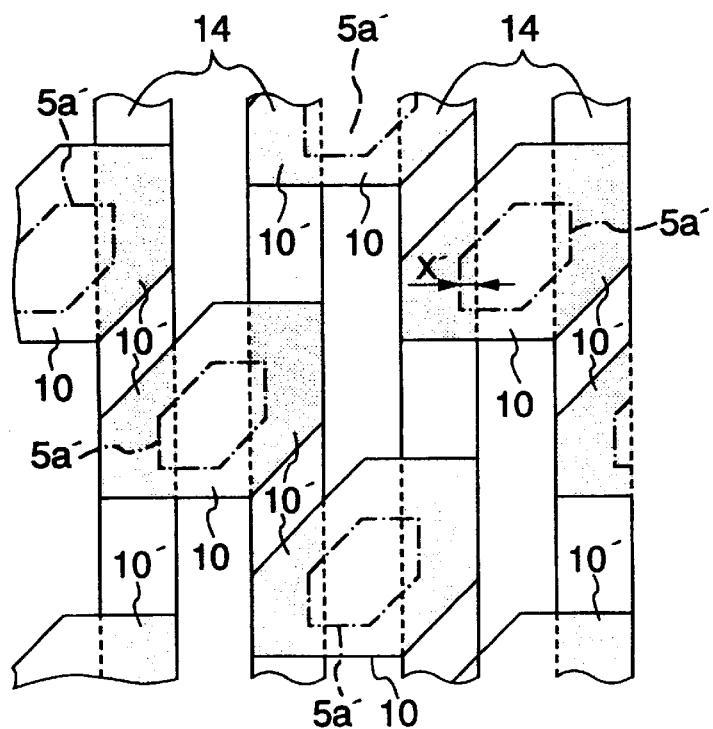
Figure 5A:
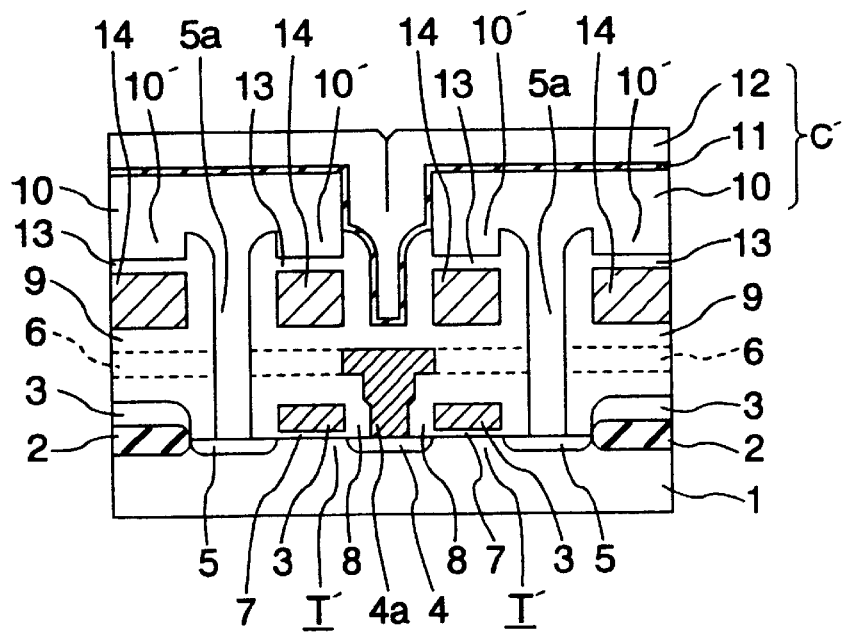
FIGS. 5A and 5B are cross-sectional views taken along lines VA—VA and VB—VB in FIG. 4A together with part of the peripheral circuit of the DRAM in FIG. 5B.

FIG. 4A is a schematic plan view of the layout of the bit lines (bit line conductor films) 6 and the underlying portions of the cell array section of the DRAM according to one embodiment of the present invention, and FIG. 4B is a schematic plan view of the layout of the portions of the cell array section overlying the bit lines 6. FIG. 5A is a schematic cross-sectional view taken along the line VA—VA in FIG. 4A, FIG. 5B is a schematic cross-sectional view taken along the line VB—VB together with a cross-sectional diagram of a selection transistor portion of the peripheral circuit section on the right-hand side.

Figure 5B:
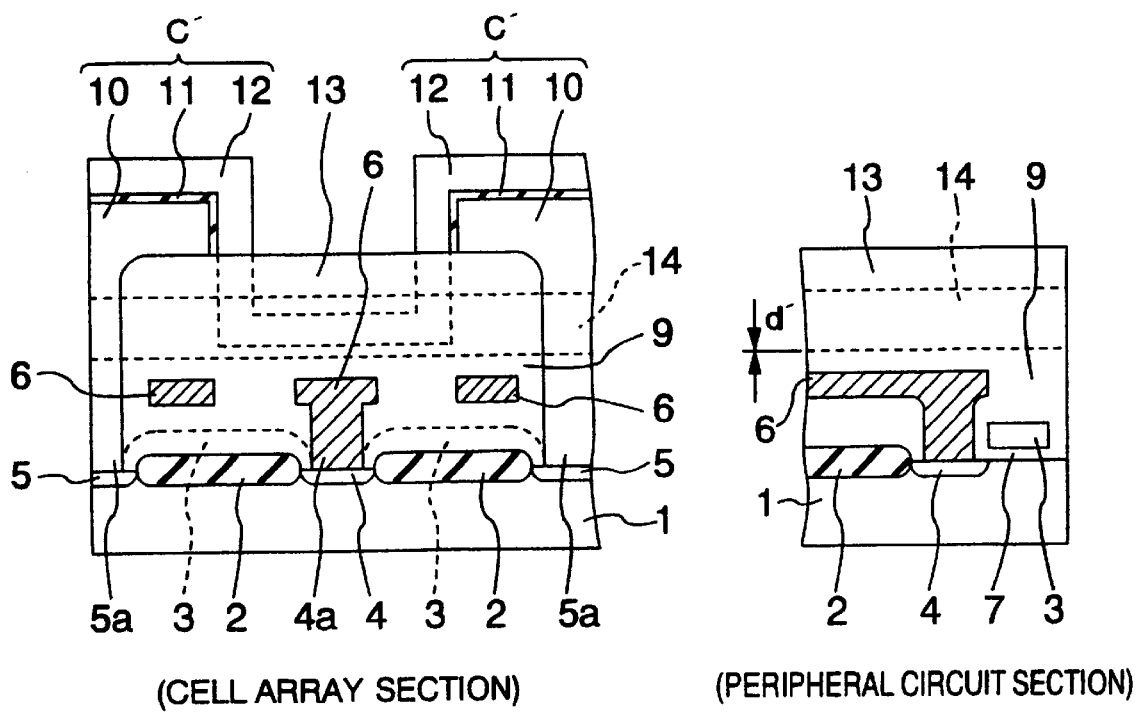

Referring to FIG. 4A and FIGS. 5A and 5B, a plurality of gate electrode films, or gate electrode connection conductors 3 of N-type polycrystalline silicon layers are formed over a P-type silicon substrate 1 in a first direction, and a pair of active layers (or regions), for example, diffusion layers (or regions) 4 and 5, are formed in a surface portion of the silicon substrate at each of the regions defined by the gate electrode connection conductors 3 and isolation oxide films 2. The gate electrode connection conductors 3 or first word line conductors and the diffusion layers 4, 5 constitute transistor structures T'. A plurality of bit line conductor films 6 of laminated connection conductors, which are comprised of, for example, tungsten silicide and, a N-type polycrystalline silicon layer, are formed over the silicon substrate 1 in a second direction which is transverse to the first direction. The bit line conductor films 6 are connected through bit contacts 4a to first N-type diffusion layers 4. Second N-type diffusion layers 5 are connected through storage node contacts 5a to storage node electrodes 10 of capacitor structures C'.

In this embodiment, as illustrated, word line conductor films (strapping word line conductor films or second word line conductors) 14 of low-resistance conductors, such as of aluminum or tungsten, are formed over a first interlayer insulating layer 9 of BPSG (boro-phosphosilicate glass) that is formed on the bit line conductor films 6. The storage node electrodes 10 are formed at a level higher than the word line conductor films 14. The word line conductor films 14 are made in electrical contact with just the underlying gate electrode connection conductors 3 at certain locations not shown.

As illustrated in FIG. 4B and FIGS. 5A and 5B, cell plate electrodes 12 of N-type polycrystalline silicon layers are formed on capacitance insulating films (dielectric films) 11 of ferroelectric films such as ONO (oxide-nitride-oxide) or $Ta_2O_5$ which is formed on the storage node electrodes 10.

In the drawings, there are also shown gate oxide films 7, sidewall oxide films 8 and second interlayer insulating films 13 of BPSG.

In the above-described structure, a one bit memory cell includes a transfer gate MOS transistor structure T' and a capacitor structure C'. The transfer gate structure T' has the gate electrode connection conductor (gate electrode film) 3 as the gate electrode, and a pair of active layers 4, 5 as the source and drain which are located on both sides of the gate electrode. The capacitor structure C' has the storage node electrode 10 connected to the N-type active layer 5 of the MOS transistor structure, the capacitance insulating layer 11 and the cell plate electrode 12. Every two adjacent memory cells arranged in the direction of the bit line conductor films 6 share one common active layer 4.

In addition, the paired active layers 4, 5 of each memory cell are displaced to each other in the direction of the gate electrode connection conductors, or along the word line conductor films 14. Moreover, the so-called COB structure is employed in which the capacitor structure C' of each memory cell is formed at a higher level than the bit line conductor films 6. Since the bit line conductor films 6 can be formed at a relatively low level as illustrated in FIG. 5B, the level difference of bit line conductor films 6 between the cell array section and the peripheral circuit section can be substantially reduced to zero, and thus the problem with the fine patterning process for bit line conductor films 6 can be solved.

Furthermore, since this embodiment additionally employs the COW structure in which the capacitor structure C' is formed at a higher level than the word line conductor films 14, or the word line conductor films 14 are located at a lower level than the capacitor structure C', the word line conductor films 14 can be formed at a relatively low level as shown in FIG. 5B. Thus, the level difference of the word line conductor films 14 between the cell array section and the peripheral circuit section can be almost reduced to zero with a result that the problem with the fine patterning process for word line conductor films 14 can be solved.

Therefore, according to this embodiment, the storage node electrodes 10 can be formed in a three-dimensional shape without any adverse effect on the DOF margin to both bit line conductor films 6 and word line conductor films 14. In other words, the storage node electrodes 10 can be formed to have a cubic structure, such as thick films, cylinders, fins or irregular shapes, thereby increasing the effective area of the capacitor structure C'. Reference symbols 5a' represent a mask pattern (19) for defining contact holes 5a which will be described later with reference to FIG. 6E.

An example of the method of producing the structure of this embodiment will be described with reference to FIGS. 6A–6G.

Figure 6A:
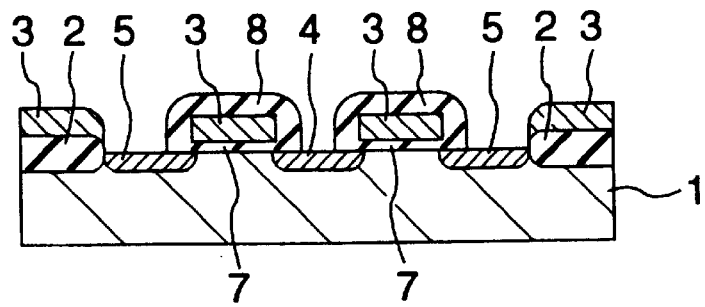
FIGS. 6A–6G are cross-sectional flow diagrams of the successive steps in the method of producing the DRAM of the embodiment of the present invention.

First, as shown in FIG. 6A, isolation oxide films 2 about 4000Å thick are formed at the surface of the P-type silicon substrate 1 by LOCOS. In addition, gate oxide films 7 about 100–150Å thick are grown in a steam atmosphere of 800–900° C. on the regions of the silicon substrate 1 which were defined by the isolation oxide films 2. Moreover, an N-type polycrystalline silicon layer 3 is deposited in a gas atmosphere of $PH_3+SiH_4$ (or $SiH_2Cl_2$) at a temperature of 550–600° C. by LP (low pressure) CVD, and then a non-doped silicon oxide film (not shown) is similarly deposited on the N-type polycrystalline silicon layers 3 by LP CVD. These films are patterned to form the gate electrode connection conductors (gate electrode films) 3. Thereafter, phosphorus (P) is introduced into the silicon substrate 1 by ion implantation with a dosage of $1\times10^{13}$–$3\times10^{13}$ cm$^{-2}$ and an acceleration energy of 40–60 KeV to form an LDD (lightly doped drain) layer (not illustrated). Then, a silicon oxide film 8 is deposited over the entire surface of the resulting substrate and anisotropically etched so that side wall oxide films 8 about 0.15–0.20 μm thick are formed on the side walls of the gate electrode connection conductors 3.

Also, arsenic (As) is introduced into the silicon substrate 1 by ion implantation with a dosage of $5\times10^{15}$ cm$^{-2}$ and an acceleration energy of 50–70 KeV to form N-type diffusion layers (active layers or regions) 4 and 5.

Figure 6B:
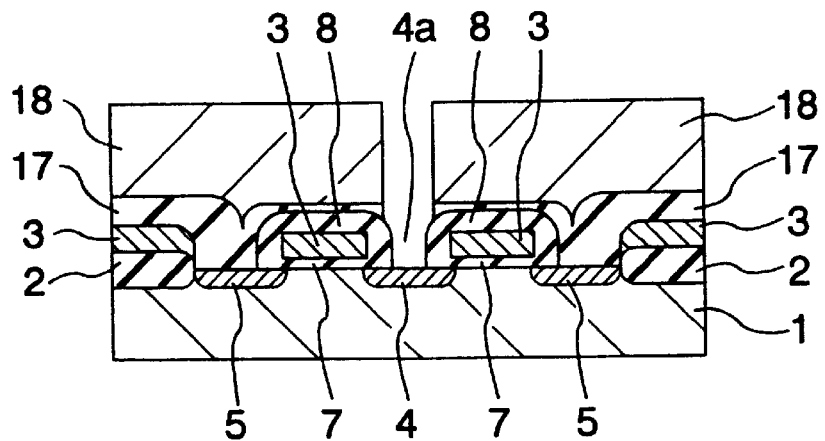

Then, as shown in FIG. 6B, a non-doped silicon oxide film 17 is formed over the entire surface of the resulting substrate by LP CVD in order to cover the active layers 4 and 5, and openings 4a are formed only in those areas of the silicon oxide film 17 which are located on the N-type active layers 4 by photolithography using a photoresist 18.

Figure 6C:
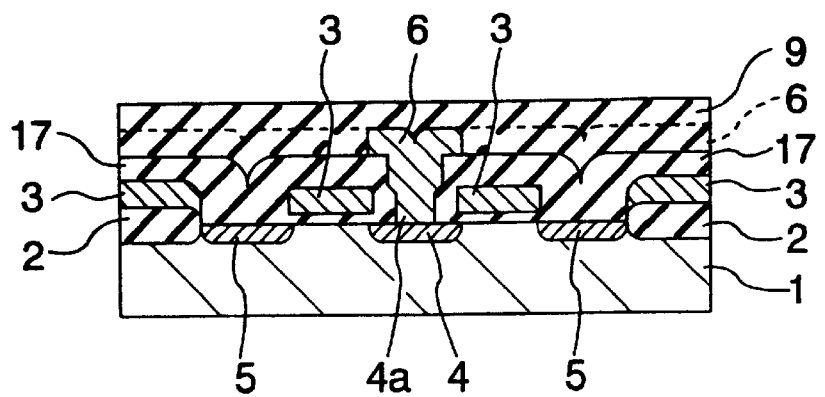

Thereafter, as shown in FIG. 6C, after removing the photoresist 18, an N-type polycrystalline silicon layer about 500Å thick is deposited by LP CVD and then a tungsten silicide layer about 2000Å thick is formed by sputtering. These layers are patterned to form bit lines 6. Next, a BPSG film about 4000–5000Å thick is deposited over the substrate by atmospheric pressure CVD to form a first interlayer insulating film 9.

Figure 6D:
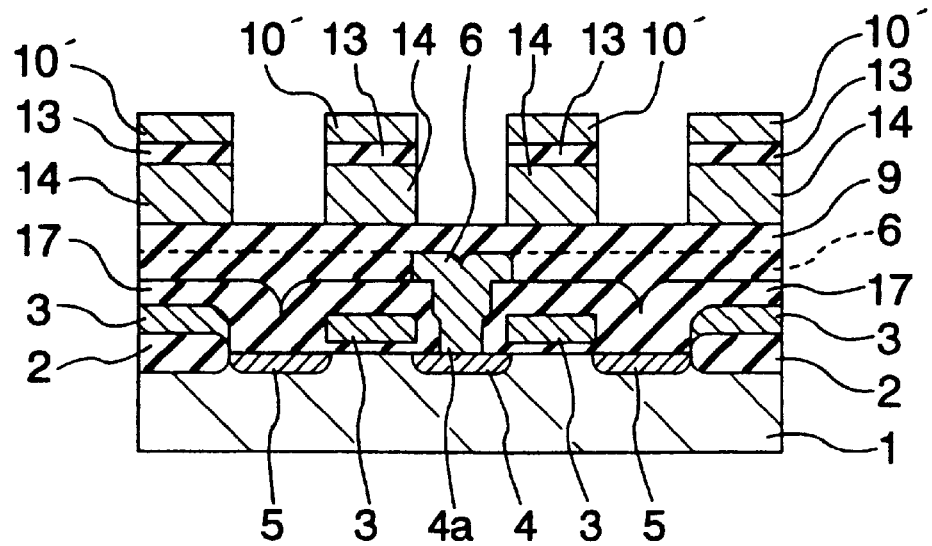

As illustrated in FIG. 6D, a titanium nitride layer about 1000–1500Å thick and then a tungsten layer about 4000Å thick are sequentially deposited over the film 9 by CVD to form a conductor film 14 for word line conductor films. Thereafter, a second interlayer insulating film 13 of BPSG and an N-type polycrystalline silicon layer 10' are successively deposited over the substrate by atmospheric pressure CVD and LP CVD, respectively. These layers are patterned to form word line conductor films 14. The film 10' is made of a material which has an etching speed much lower than that of films 9 and 17. For example, the ratio of the etching speeds of the film 10' and the films 9 and 17 may be 1:50.

Figure 6E:
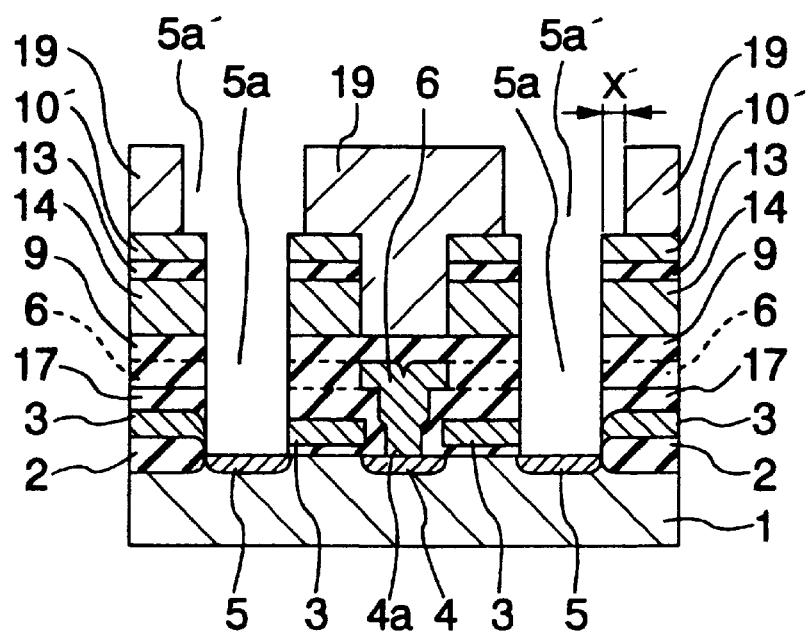

Moreover, as shown in FIG. 6E, storage node contact holes 5a are formed reaching the surface of the N-type active layers 5 by photolithography using a photoresist 19. In this case, although the holes provided in the photoresist 19 are larger (for an alignment margin) than the size of the desired storage node contact holes 5a, the N-type polycrystalline silicon layer 10', which has been formed in the same pattern as the word line conductor films 14 when the films 14 are produced by patterning, serves as an etching stop mask so that the first interlayer insulating film 9, the silicon oxide film 17 and the side wall oxide film 8 are etched to form the storage node contact holes 5a of a desired size reaching the surface of the N-type diffusion layer 5.

Figure 6F:
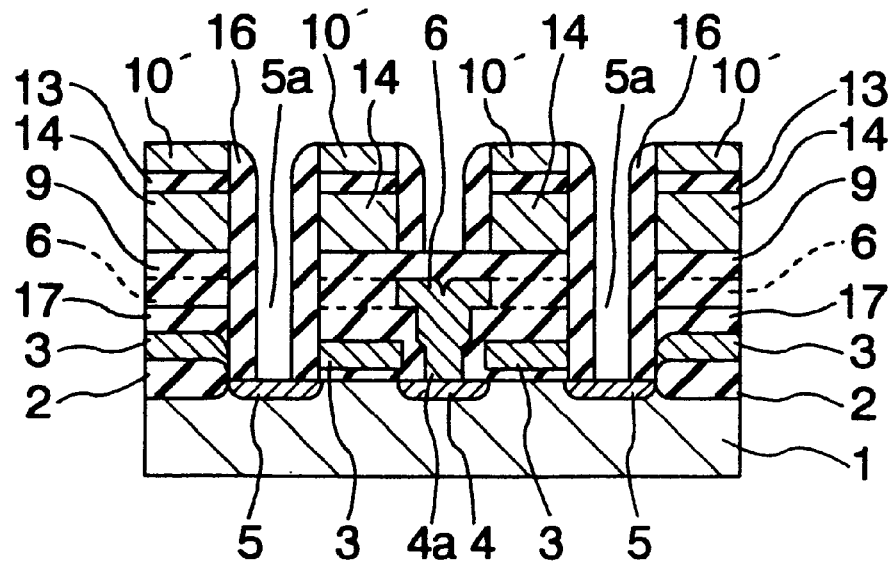

As shown in FIG. 6F, after removing the photoresist 19, a silicon oxide film 16 is deposited over the entire surface of the resulting substrate by LP CVD, and anisotropically etched to form contact wall insulating films 16 only on the side walls of the storage node contact holes 5a.

Figure 6G:
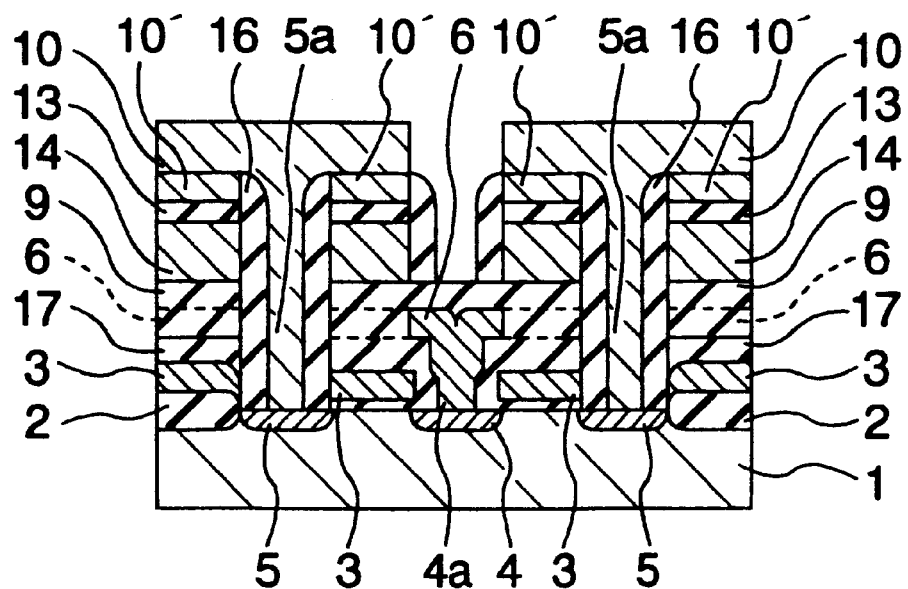

Thereafter, as shown in FIG. 6G, an N-type polycrystalline silicon layer 10 is deposited over the entire surface of the substrate by LP CVD and pattered to form storage node electrodes 10. At this time, of the N-type polycrystalline silicon layers 10' formed on the word line conductor films 14, those portions on which any storage node electrode is not provided are also etched away.

Thereafter, an ONO film about 50Å thick is deposited on the entire surface of the resulting substrate to form capacitance insulating films (dielectric films) 11, and then cell plate electrodes 12 of an N-type polycrystalline silicon layer about 1000Å thick are formed thereon to complete the structure shown in FIGS. 5A and 5B.

According to the embodiment described above, since the N-type polycrystalline silicon layers 10', having the same pattern as the word lines 14 and formed thereon, are used as an etching stop mask when the storage node contact holes 5a are produced, a mask alignment margin x' is available as shown in FIGS. 4B and 6E such that the size of holes 5a' defined by the mask pattern 19 for the storage node contact holes 5a may be larger than the spacing between the word lines 14. Therefore, the diameter of the contacts is large enough on photolithography to provide a margin for the process.

In addition, although not shown, the bit line conductor films 6 substantially act as an etching stop mask in the direction perpendicular to the bit line conductor films 6, with a result that the storage node contacts 5a can be formed by self alignment relative to both the word line conductor films 14 and the bit line conductor films 6 (see FIG. 4A). Moreover, the contact side wall insulating films 16 formed later electrically insulate the contacts from both word lines and bit lines.

Also, according to the above-described embodiment, since the capacitor portion of each memory cell is formed after the activation process effected after ion implantation following the formation of the contact holes to the N-type diffusion layers, and since the capacitor portion of each memory cell is formed after the reflow process for the BPSG films, a ferroelectric film which cannot be treated at a high temperature may be advantageously used for the capacitance insulating film (the dielectric film) of the capacitor structures C'.

As has been described above, since the word line conductor films can be formed at a lower level than the memory cell capacitor structures C', the level difference d' of word line conductor films between the cell array section and the peripheral circuit section can be almost reduced to zero as shown in FIG. 5B, with a result that the DOF margin with respect to the word lines can be assured in the fine patterning process, or that fine patterning can be performed.

Furthermore, since the storage contact of each memory cell can be formed in a self alignment manner relative to both the bit line conductor films and word line conductor films, there is no need to provide an alignment margin to those line films, and as a result, very small devices can be produced.

I claim:

1. A semiconductor memory device comprising:
   a memory cell array having a plurality of memory cells arranged substantially in a matrix, each memory cell having a transistor structure formed at a semiconductor substrate and a capacitor structure formed over said semiconductor substrate; and the transistor structures having control electrodes arranged in one direction in said memory cell array, a predetermined number of said control electrodes being integrally formed with first word line conductors, wherein the semiconductor memory device further includes:
     bit line conductors formed over said first word line conductors with a first insulating layer interposed therebetween, said bit line conductors extending transversely to said first word line conductors and being in contact with first active regions of the transistor structures of those of said memory cells which are arranged transversely to said first word line conductors;
     second word line conductors formed over said bit line conductors with a second insulating layer interposed therebetween, said second word line conductors extending in parallel with said first word line conductors, being in contact with said first word line conductors at predetermined locations and serving as strapping word line conductors;
     lower electrode films for said capacitor structures of said memory cells, said lower electrode films being formed over said second word line conductors with a third insulating layer interposed therebetween and being in contact with second active regions for said transistor structures of said memory cells; and
     upper electrode films for said capacitor structures, said upper electrode films being formed over said lower electrode films with capacitance insulating films interposed therebetween.

2. A semiconductor memory device comprising a word line conductor, a bit line conductor transverse to said word line conductor and a memory cell having a transistor structure and a capacitor structure, wherein:
   said word line conductor serves as a strapping word line conductor and is formed between said capacitor structure and said bit line conductor; and
   said bit line conductor is formed at a level higher than said transistor structure;
   said transistor structure has a pair of active layers formed in a surface portion of a semiconductor substrate and a gate electrode film formed between said pair of active layers over said surface portion of said substrate;
   a first insulating film is formed covering a surface of said substrate including exposed surfaces of said active layers, said bit line conductor being formed at least on said first insulating film;
   a second insulating film is formed covering said bit line conductor, said word line conductor being formed at least on said second insulating film; and
   said capacitor structure is formed over said word line conductor and is insulated from said word line conductor.

3. A semiconductor memory device comprising:
   a memory cell array having a plurality of memory cells arranged in a matrix, each memory cell having a transistor structure and a capacitor structure formed over a semiconductor substrate; the transistor structures having control electrodes arranged in one direction in said memory cell array, a predetermined number of said control electrodes being integrally formed with first word line conductors wherein the semiconductor memory device further includes:
   bit lines conductors formed over said first word line conductors with a first insulating layer interposed therebetween;
   second word line conductors formed over said bit line conductors with a second insulating layer interposed therebetween; and
   each of said capacitor structures having lower electrode film formed over an associated one of said second word line conductors with a third insulating layer interposed therebetween, said second word line conductors serving as strapping word line conductors.

4. A semiconductor memory device comprising:
   a semiconductor substrate;
   a transistor structure having active regions formed in a surface of said semiconductor substrate and a control electrode formed between said active regions over said surface of the semiconductor substrate;
   a first conductive layer formed over said semiconductor substrate, said first conductive layer being insulated from said semiconductor substrate and connected with one of said active regions;
   a second conductive layer transverse to said first conductive layer, said second conductive layer being at a level higher than said first conductive layer and serving as a strapping word line conductor;

a third conductive layer formed over said second conductive layer, said third conductive layer being insulated from and being in a pattern identical with that of said second conductive layer;

a contact hole through said first, second and third conductive layers; and a side wall insulating film formed to cover side surfaces of layers including said first, second and third conductive layers defining said contact hole.

5. A semiconductor memory device according to claim 4, further comprising a capacitor structure being at a level higher than said second conductive layer serving as a strapping word line conductor.

* * * * *